United States Patent
Linger et al.

(10) Patent No.: US 7,429,929 B2
(45) Date of Patent: Sep. 30, 2008

(54) SAFETY DEVICE

(75) Inventors: Mats Linger, Onsala (SE); Torgny Olsson, Svedala (SE)

(73) Assignee: Jokab Safety AB, Kungsbacka (SE)

( * ) Notice: Subject to any disclaimer, the term of this patent is extended or adjusted under 35 U.S.C. 154(b) by 0 days.

(21) Appl. No.: 11/449,836

(22) Filed: Jun. 9, 2006

(65) Prior Publication Data
US 2006/0279417 A1    Dec. 14, 2006

Related U.S. Application Data

(63) Continuation of application No. 10/475,670, filed as application No. PCT/SE02/00798 on Apr. 23, 2002, now abandoned.

(30) Foreign Application Priority Data
Apr. 23, 2001    (SE)    .................................... 0101450

(51) Int. Cl.
*G08B 21/00* (2006.01)
(52) U.S. Cl. .................. 340/658; 340/508; 340/512

(58) Field of Classification Search .................. 340/508
See application file for complete search history.

(56) References Cited

U.S. PATENT DOCUMENTS

| 3,611,361 | A |   | 10/1971 | Gallichotte et al. |
| 3,634,824 | A |   | 1/1972  | Zinn et al. |
| 4,356,475 | A |   | 10/1982 | Neumann et al. |
| 4,543,566 | A | * | 9/1985  | Buck et al. .................. 340/512 |
| 4,906,979 | A |   | 3/1990  | Kimura |

FOREIGN PATENT DOCUMENTS

| EP | 0 729 124 A1 | 8/1996 |
| GB | 2 233 803 A  | 1/1991 |

* cited by examiner

*Primary Examiner*—George A Bugg
(74) *Attorney, Agent, or Firm*—Young & Thompson

(57) ABSTRACT

A safety device includes a safety module (11), a data bus (12) and one or several transmitters (15, 16, 17, 18, 19, 20). The safety module transmits a pulse train (one dynamic signal) over the bus (12) constituting a loop, whereby the pulse train is connected to each of the transmitters, wherein the pulse is phase inverted.

8 Claims, 6 Drawing Sheets

BLOCK DIAGRAM

| CONDITIONS FOR THE RELAY-OUTPUTS (13-14) AND (23-24) OF THE SAFETY MODULE SHOULD BE ABLE TO PULL | | | |
|---|---|---|---|
| CONNECTION (IN SERIES) OF SENSORS, ETC. | T1. SIGNAL TO THE FIRST SENSOR | R1. SIGNAL FROM THE LAST SENSOR | S1. PHASE INVERSION |
| ODD NUMBER OF SENSORS, ETC. (PHASE INVERSIONS) | ⎍ | ⎍ SAME PHASE AS IN T1 | CONNECTED TO A1+ |
| EVEN NUMBER OF SENSORS, ETC. (PHASE INVERSIONS) | ⎍ | ⎍ PHASE INVERTED FROM T1 | NOT CONNECTED |

FIG. 5 (PROCEEDING)

SAFETY DEVICE

The invention relates to a dynamic safety loop for monitoring different safety transmitters.

BACKGROUND OF THE INVENTION

Electronic monitoring systems of a similar type have previously been described. In U.S. Pat. No. 4,543,566 an electronic monitoring system comprising a contact less movement detector is described. The movement detector comprises an oscillator with a sensing coil, having an output connected to an input of a first gate with another input connected to a square wave generator, the pulses of which appear at the output of the first gate, with or without phase inversion depending on the output voltage of the movement detector. These pulses are fed, via an amplifier, to an input of a second gate, the input of which directly receives the output pulses from the square wave generator, but having a delay. If a fault occurs, disturbing the pulse transmission to any of the inputs to this second gate, its output becomes a pulsating voltage. Further, an integrator being parallel coupled with the second gate to the amplifier output can introduce such a fault.

DETAILED DESCRIPTION OF EMBODIMENTS

Figure 1:
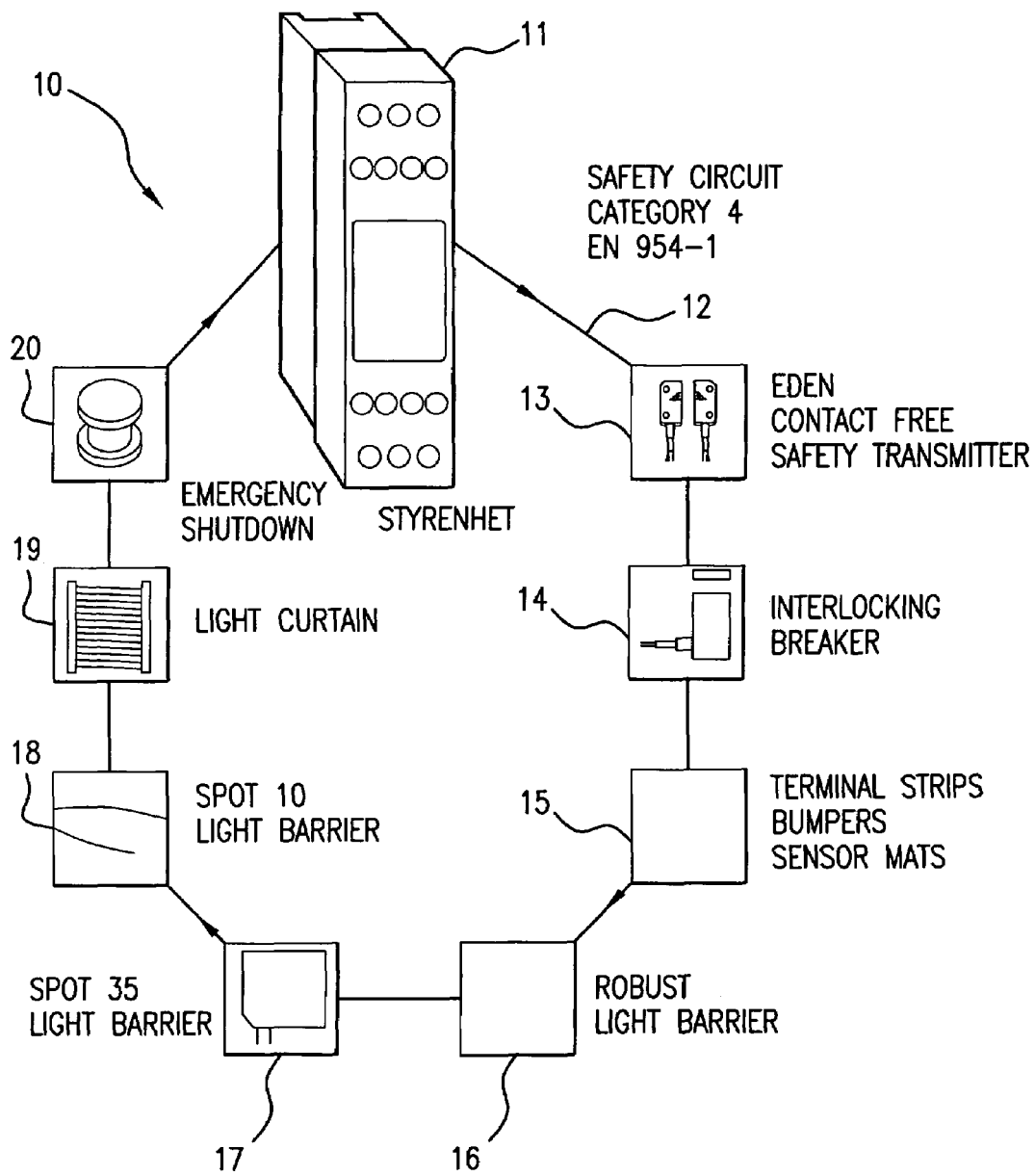
FIG. 1 shows a safety loop according to the invention.

FIG. 1 shows a safety loop 10 according to the invention, which is described in the following.

A safety module 11 is the main part of the system according to the invention, sending out a pulse train (a dynamic signal) over a bus 12 constituting the loop. The pulse train leading to each transmitter wherein the pulse is phase inverted. Different modules can be connected to the loop. A sensor 13, an inverse switch 14, terminal strips/sensor mats/bumpers 15, light 16/17/18, light curtains 19 and an emergency stop 20 are examples of these modules. Obviously, other modules can occur. The safety module permits installation of several safety means to the same safety modules simultaneously as a safety of category 4 according to EN 954-1 is obtained. Moreover, the safety module can also be provided with an automatically or manually monitored resetting, double safety outputs, information output for restoration indication and output for status information to a PLC (Programmable Logic Controller).

From a safety point of view, faults, e.g. a short circuit or interruption, may not lead to a dangerous situation. According to the present solution, interruption and short circuit at each sensor leads to a stop signal directly to dangerous machines or processes, since the signal must be turned at each transmitter. The safety module 11 also controls that the signal is time shifted, i.e. the signal being sent from the safety module must also be time shifted in relation to the signal coming back. This implies that the safety module may receive pulses being inverted and not inverted, respectively, with respect to the signal being sent, without the risk for short circuit could imply a dangerous situation.

The time shift may also be varied with the number of transmitters mounted. Thereby additional control of the number of transmitters is correct is obtained.

The pulse train being sent is compared to the pulse train coming back. The safety module achieves the controls amongst others the time shift and the frequency. If the signal is correct the safety outputs are kept closed. When an error signal or a stop signal from one or several transmitters is received, the safety outputs are opened.

Figure 2:
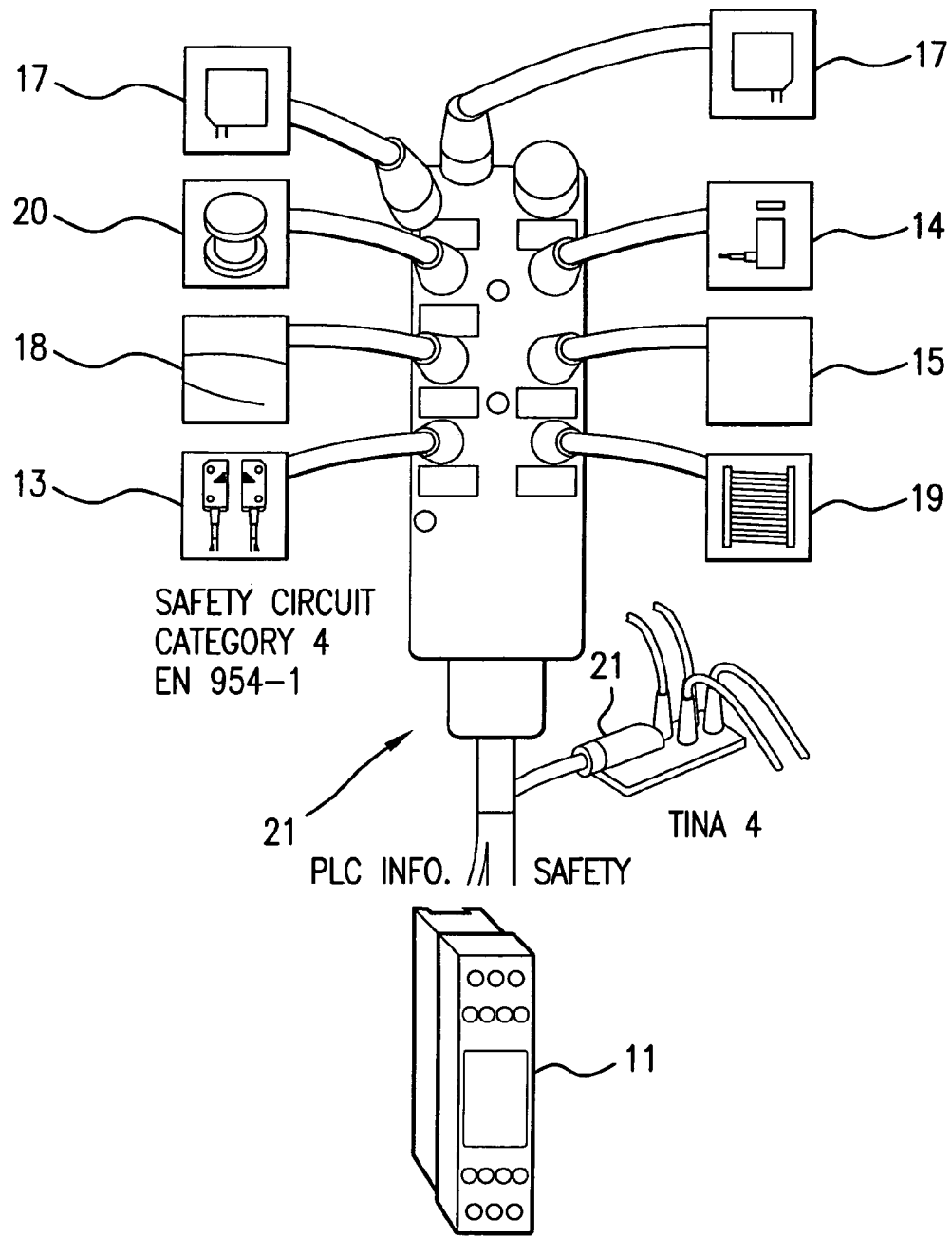
FIG. 2 shows a first arrangement in the safety loop according to the invention.

The transmitters being coupled to the dynamic safety loop can be electronic and mechanical having an electronic adjustment. An emergency shutdown has one or two switching contacts being compulsively opened when the emergency shutdown button 20 is pushed. For adjusting the emergency shutdown to the dynamic safety loop, an electronic unit is mounted comprising the pulse inversion function. As long as the conductors are closed, the electronic unit pulse inverts the incoming signal and sends the pulse inverted signal further to the next transmitter or back to the safety module. In the same way, all types of mechanical transmitters can be coupled to the loop. For a high security level, its switching contacts need to be force controlled, i.e. they are pushed apart by the actuating force. Terminal strips, sensor mats and bumpers can be connected to the dynamic safety loop. It is also possible to connect the terminal strips, sensor mats and bumpers working with closing function for stop signal and the ones working with switching function for stop signal, since both switch and short circuit lead to that the safety module gives a stop signal. For facilitating the possibilities for interconnecting, there are junction boxes 21, being shown in FIG. 2, with an output for a great number of transmitters and provided with pulse inverters. This junction box also contains a pulse inverter ensuring that the output signal is always phase inverted compared to the input signal. The junction box is coupled to a safety module via the bus, which contains the information of each sensor. This facilitates the delivery of the machines prepared for rapid coupling with the safety sensors. The sensors may also be coupled to the safety module via the regular contacts.

Figure 5:
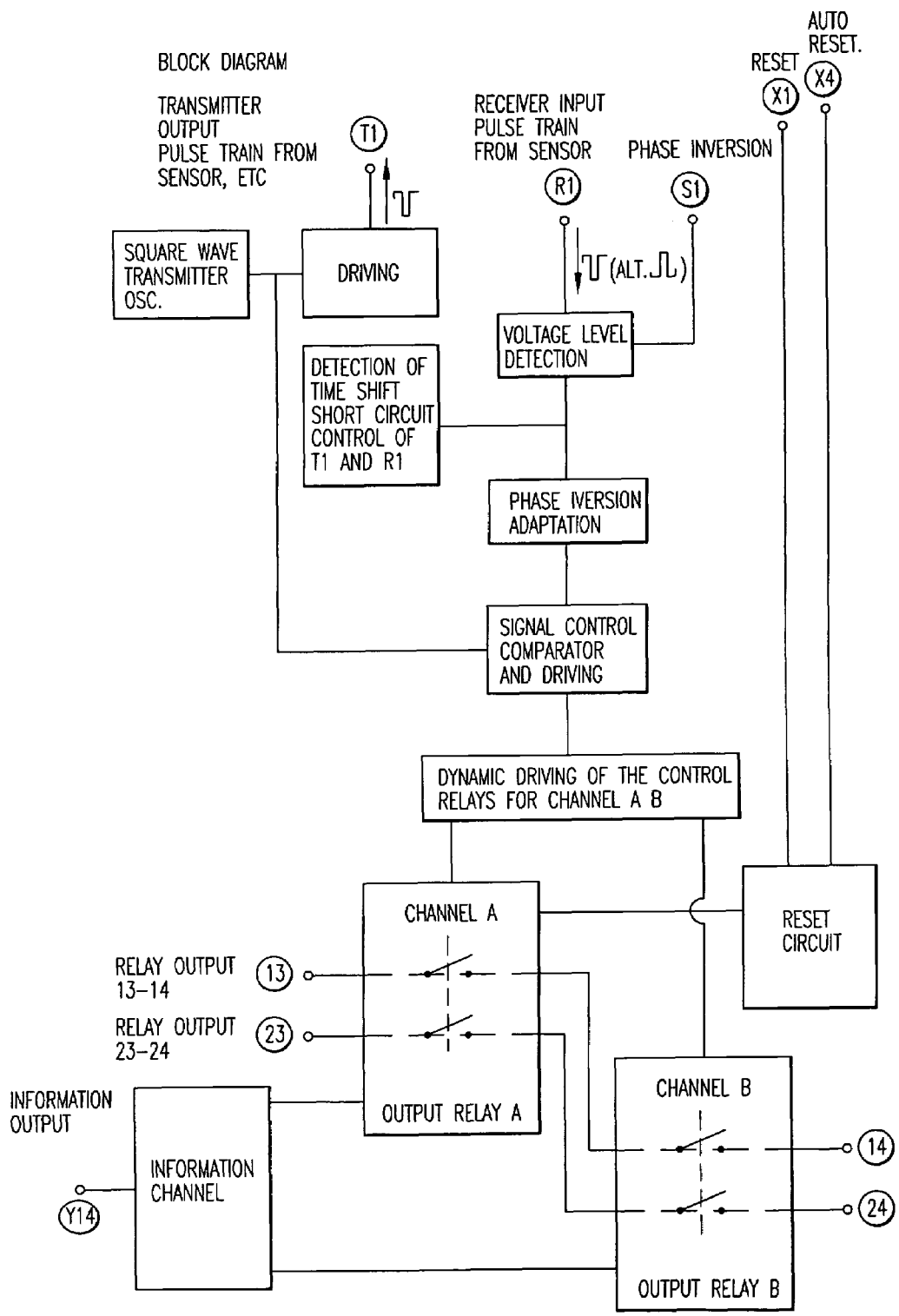
FIG. 5 shows a detailed schedule of the loop.

With reference to FIG. 5, the function of the loop is described closer. The safety module has a transmitter generating a square wave internally, being sent to the first sensor via the connection This internal square wave is internally connected to the Block: the detection of the time shift and short circuit control and R1, and to the Block: the signal control, comparator and driving.

The signal received in R1, coming from the last sensor in the serial chain, then will pass a voltage level detector (block) for comparing phase and delay time to the internal signal of the transmitter. Every sensor, etc, gives a signal being delayed (and phase inverted) in relation to its input signal. If a short circuit occurs between T1 and R1 (and/or between the conductors which is connected to them) the detecting block will discover that (due to no delay between T1 and and not allow the output relays of the safety module to pull and risk a dangerous position. This is particularly relevant when the connection is according to alternative 1 since T1 and R1 is in the same phase (but delayed). Depending on the original installation of the system, alt. 1 or alt. 2 (see below and in the table of the block diagram) and if everything works normally, the signal will be allowed to go further to the Signal control block, comparator and driving, which controls if the "shape" of the signal (frequency, dissymmetry and total delay) is approved (with a certain tolerance). If approved, it will go further to the next block for enabling a start of the output relays.

Alt. 1: Even number of sensors (phase inversions) in series between T1 and R1. T1 and R1 are in the same phase (but delayed) if the sensors give transmission (e.g. locked doors, etc.). Condition: S1 must be connected to A1 (+supply voltage).

Alt. 2: Odd number of sensors (phase inversions) in series between T1 and T1 and R1 are phase inverted (and delayed) if the sensors give transmission (e.g. locked doors, etc).

Condition: S1 should not be connected.

The great advantage with this system is that several different sensors/transmitters can be coupled in the same loop at the same time as the loop keeps a high security level. The dynamic safety loop is simple; it connected to one transmitter and back out of the transmitter. Since it is dynamic, short circuit always results in immediate stop signal from the safety module. For e.g. two-channel solutions short circuits are only monitored at every stop occurrence, which implies that short-circuits can be accumulated, which are not discovered gradually. Finally, the protection may not work at all. This does not occur with dynamic monitoring since short circuit in the safety loop immediately results in a stop.

Figure 3:
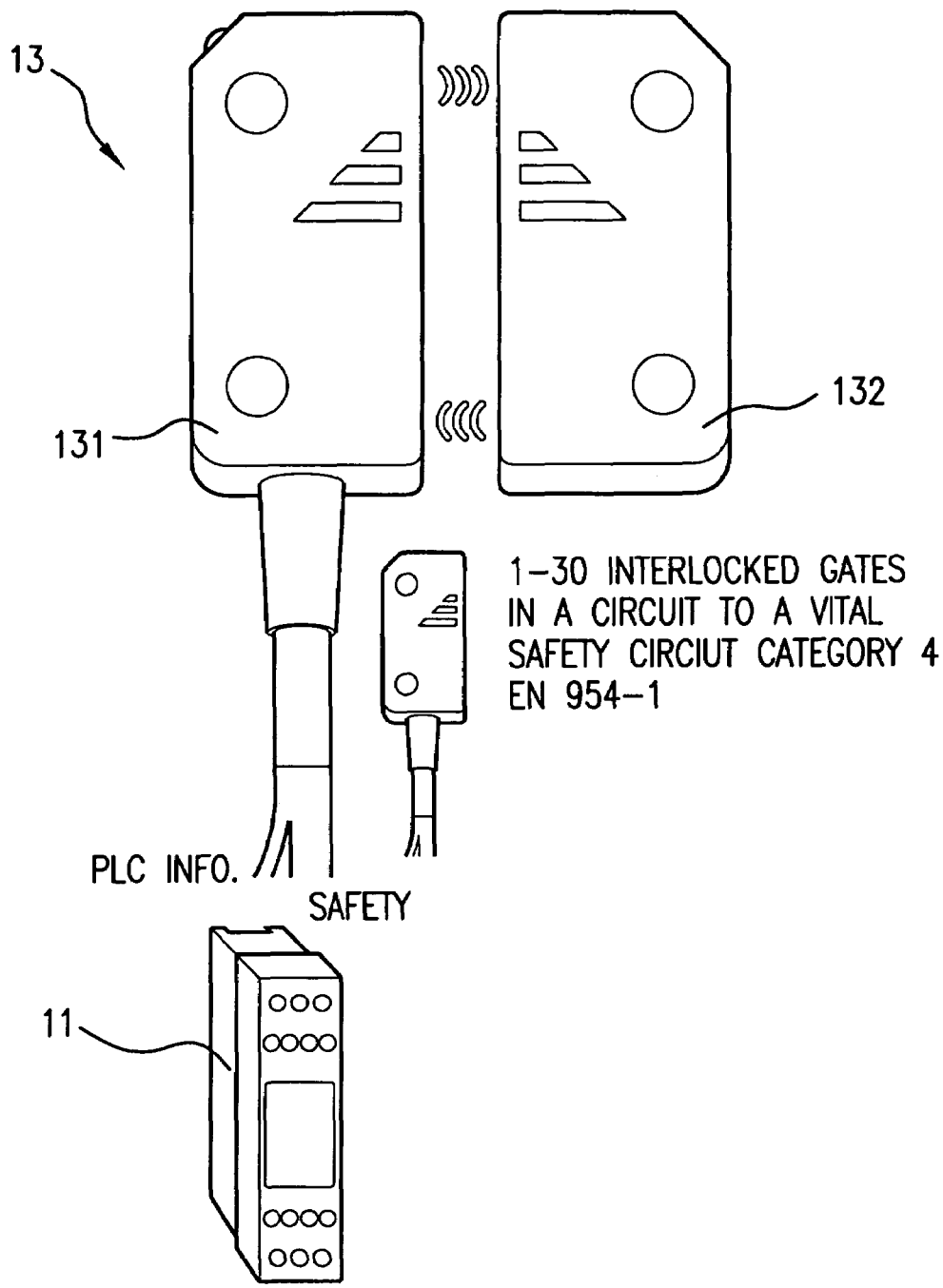
FIG. 3 shows a second arrangement in the safety loop according to the invention.

Moreover, a contact-free switch 13 or contact breaker can be connected to the loop, which is shown in detail in FIG. 3. The switch can be used for e.g. block switches, interlock disc covers, etc. The switch comprises two parts 131 and 132. The first part 131 receives a coded signal from the safety module, which is sent to the second part 132, which modifies the signal and sends it back to the first part. The switch can be connected in series with light barriers and emergency shutdowns and give the same high confident coefficient in the safety module.

Figure 4:
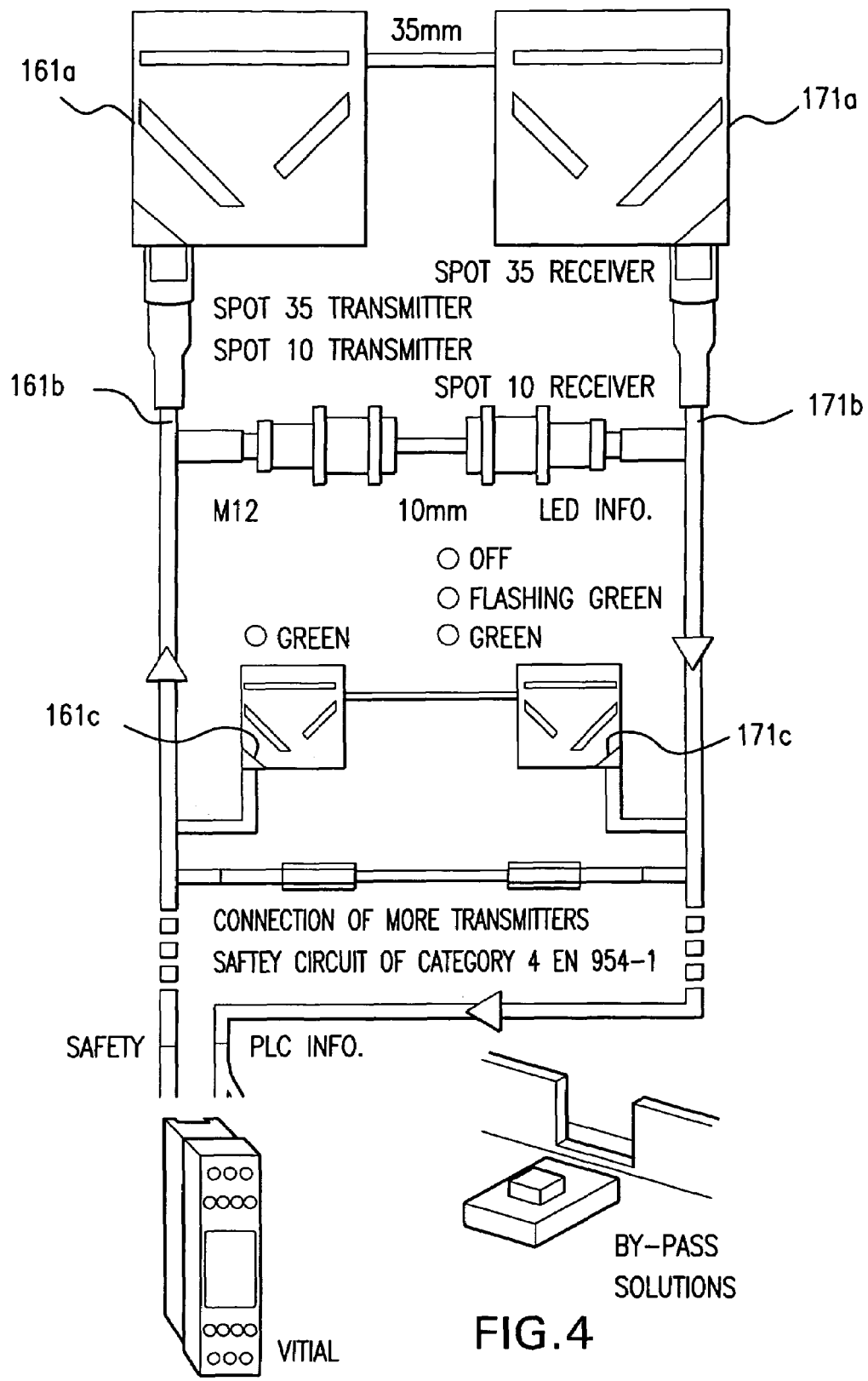
FIG. 4 shows a third arrangement in the safety loop according to the invention.

FIG. 4 shows the connection to the loop of the light transmitters 161a, 161b and 161b and the optic receivers 171a, 171b and 171c. The signal is sent to the transmitters from the safety module 11 on one side of the loop and received from the receivers.

The invention is not limited to the shown embodiments but can be varied in a number of ways without departing from the scope of the appended claims and the arrangement and the method can be implemented in various ways depending on application, functional units, needs and requirements, etc.

What we claimed is:

1. A safety device, comprising:
   a safety module;
   external sensors, each of said sensors having a transmitter; and
   a data bus for connecting said module to said sensors, wherein,
   said safety module comprises means for transmitting a signal in form of a transmitted first pulse train over said bus, the bus forming a loop to said external sensors, said first pulse train being connected to each of said sensors, each of said sensors comprising means to phase invert said first pulse train,
   said safety module is configured to receive a second pulse train from said sensors, control said second pulse train from said sensors, and detect a time delay in said second pulse train, and
   an absence of said time delay detected by said safety module indicates an error in one of said sensors.

2. The device as claimed in claim 1, wherein said sensors comprise at least one of an inversed switch, terminal strips, sensor mats, bumpers, light transmitters, light receivers, light curtains and emergency button.

3. The device as claimed in claim 1, wherein said device further comprises at least one of an automatically or manually monitored resetting, double safety outputs, information output for restoration indication, and output for status information to a PLC (Programmable Logic Controller).

4. The device as claimed in claim 1, wherein said first pulse train sent out from said safety module is time delayed in relation to said second pulse train from said sensors.

5. The device as claimed in claim 4, wherein said time delay varies with a number of coupled transmitters, whereby a determination of a correct number of transmitters in said loop is obtained.

6. The device as claimed in claim 1, wherein said transmitted pulse train is compared to a received pulse train, and said safety module controls said time delay of said second pulse train and a frequency of said second pulse train.

7. The device as claimed in claim 6, wherein,
   if the signal is correct, safety outputs are kept closed, and
   if any of an error signal or stop signal is received from one or several of the transmitters, the safety outputs are opened.

8. A method for a safety device, comprising the steps of:
   sending a pulse train from a safety module, over a data bus constituting a loop, to sensors connected to the loop;
   inverting the phase of the pulse train at each of the sensors;
   comparing the pulse train sent from the safety module to a received pulse train received by the safety module from the loop,
   wherein failure to detect a time delay between the pulse train and the received pulse train indicates an error in one of said sensors.

* * * * *